US012648094B2

(12) United States Patent
Ngo et al.

(10) Patent No.: US 12,648,094 B2
(45) Date of Patent: Jun. 2, 2026

(54) PORTABLE ELECTRONIC DEVICE

(71) Applicant: SAMSUNG ELECTRONICS CO., LTD., Suwon-si (KR)

(72) Inventors: Van Thang Ngo, Pho Yen (VN); Dac Tri Bui, Pho Yen (VN); Van Duc Le, Pho Yen (VN); Trinh Nam Nguyen, Pho Yen (VN); Van Huy Nguyen, Pho Yen (VN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 169 days.

(21) Appl. No.: 18/749,173

(22) Filed: Jun. 20, 2024

(65) Prior Publication Data

US 2024/0414859 A1    Dec. 12, 2024

Related U.S. Application Data

(63) Continuation of application No. PCT/KR2024/007167, filed on May 27, 2024.

(30) Foreign Application Priority Data

Jun. 9, 2023    (KR) ........................ 10-2023-0074236

(51) Int. Cl.
  *H05K 5/02*        (2006.01)
  *G06F 1/16*        (2006.01)
(52) U.S. Cl.
  CPC ......... *H05K 5/0217* (2013.01); *G06F 1/1626* (2013.01)
(58) Field of Classification Search
  CPC ...... H05K 5/0217; H05K 5/06; G06F 1/1626; G06F 1/1637
  See application file for complete search history.

(56) References Cited

U.S. PATENT DOCUMENTS 9,639,123 B2    5/2017   Choi et al.
10,134,540 B2   11/2018  Choi et al.
              (Continued)

FOREIGN PATENT DOCUMENTS

CN          114863808 A     8/2022
KR    10-2015-0105143 A     9/2015
              (Continued)

OTHER PUBLICATIONS

International Search Report dated Sep. 23, 2024, issued by the International Searching Authority in International Application No. PCT/KR2024/007167.

(Continued)

*Primary Examiner* — Sagar Shrestha
(74) *Attorney, Agent, or Firm* — Sughrue Mion, PLLC

(57)        ABSTRACT

A portable electronic device is provided and includes: a housing; a display including a window and a display panel, and one end of the display has a curved portion; a buffer area formed along an edge of the housing such as to correspond to the curved portion, the buffer area having a concave cross-section; a first sealing member between the display panel and the housing; a second sealing member between the window and the housing and spaced apart from the first sealing member, a connection hole, in the housing, that is between the first sealing member and the second sealing member and adjacent to the buffer area; a filling member that fills the connection hole and connects the first sealing member and the second sealing member; and a blocking member, between the connection hole and the buffer area, that blocks the filling member from flowing into the buffer area.

19 Claims, 22 Drawing Sheets

(56) References Cited

U.S. PATENT DOCUMENTS

| | | | | |
|---|---|---|---|---|
| 10,405,446 | B2 * | 9/2019 | Choi | G06F 1/1637 |
| 10,512,184 | B2 | 12/2019 | Cho et al. | |
| 10,721,830 | B2 | 7/2020 | Cha | |
| 11,281,255 | B2 | 3/2022 | Kim et al. | |
| 11,706,887 | B2 | 7/2023 | Choi et al. | |
| 11,899,503 | B2 | 2/2024 | Nguyen Van et al. | |
| 2015/0253819 | A1 * | 9/2015 | Choi | G06F 1/182 |
| | | | | 361/679.02 |
| 2017/0099742 | A1 * | 4/2017 | Choi | H05K 5/03 |
| 2018/0098446 | A1 * | 4/2018 | Choi | G06F 1/1637 |
| 2018/0310426 | A1 * | 10/2018 | Cho | H05K 5/03 |
| 2019/0239374 | A1 * | 8/2019 | Cha | H04M 1/0202 |
| 2022/0137667 | A1 * | 5/2022 | Kim | G06F 1/1616 |
| | | | | 361/679.21 |
| 2022/0253107 | A1 | 8/2022 | Nguyen Van et al. | |
| 2024/0188218 | A1 | 6/2024 | Cho et al. | |
| 2024/0427380 | A1 | 12/2024 | Guo | |

FOREIGN PATENT DOCUMENTS

| | | | |
|---|---|---|---|
| KR | 10-2018-0013436 | A | 2/2018 |
| KR | 10-2018-0118332 | A | 10/2018 |
| KR | 10-2019-0085199 | A | 7/2019 |
| KR | 10-2020-0126570 | A | 11/2020 |
| KR | 10-2021-0080690 | A | 1/2021 |
| KR | 10-2308940 | B1 | 10/2021 |
| KR | 10-2023-0023248 | A | 2/2023 |
| KR | 10-2023-0055166 | A | 4/2023 |
| KR | 10-2745243 | B1 | 12/2024 |
| WO | 2021/241783 | A1 | 12/2021 |

OTHER PUBLICATIONS

Written Opinion dated Sep. 23, 2024, issued by the International Searching Authority in International Application No. PCT/KR2024/007167.

* cited by examiner

PORTABLE ELECTRONIC DEVICE

CROSS-REFERENCE TO RELATED APPLICATIONS

This application is a continuation of International Application No. PCT/KR2024/007167 designating the United States, filed on May 27, 2024, in the Korean Intellectual Property Receiving Office and claiming priority to Korean Patent Application No. 10-2023-0074236, filed on Jun. 9, 2023, in the Korean Intellectual Property Office, the disclosures of each of which are incorporated by reference herein in their entireties.

BACKGROUND

1. Field

Embodiment of the present disclosure relate to a portable electronic device, and more particularly, to a portable electronic device using a filling member.

2. Description of the Related Art

A portable electronic device may include a housing and a display.

The display may be attached to one surface of the housing using a sealing member.

The display may include a curved portion for a three-dimensional effect. For example, the display may include curved portions on left and right sides of the display.

The sealing member may include a first sealing member disposed between three sides of the housing and three sides of the display, and a second sealing member disposed between the remaining side of the housing and the remaining side of the display.

Due to the curved portion of the display, the height at which the first sealing member is disposed may be different from the height at which the second sealing member is disposed.

A liquid filling member may be used to connect the first sealing member and the second sealing member of different heights.

SUMMARY

According to one or more embodiments of the present disclosure, a portable electronic device is provided and includes: a housing; a display including a window and a display panel, and one end of the display has a curved portion; a buffer area formed along an edge of the housing such as to correspond to the curved portion of the display, the buffer area having a concave cross-section; a first sealing member between the display panel and the housing; and a second sealing member between the window and the housing and spaced apart from the first sealing member, wherein the housing includes a connection hole that is between the first sealing member and the second sealing member and adjacent to the buffer area, and wherein the portable electronic device further includes: a filling member that fills the connection hole and connects the first sealing member and the second sealing member, and a blocking member between the connection hole and the buffer area and configured to block the filling member from flowing into the buffer area.

According to one or more embodiments of the present disclosure, the blocking member is in contact with the second sealing member and one side end of the blocking member is bent towards the connection hole.

According to one or more embodiments of the present disclosure, the blocking member is in contact with the first sealing member and another side end of the blocking member is bent toward the connection hole.

According to one or more embodiments of the present disclosure, the portable electronic device further includes a base on a lower surface of the blocking member, and wherein the base includes a closed loop shape surrounding a circumference of the connection hole.

According to one or more embodiments of the present disclosure, an upper surface of the blocking member is a curved surface corresponding to the curved portion of the display panel.

According to one or more embodiments of the present disclosure, a thickness of the blocking member gradually decreases from the lower surface of the blocking member to an upper surface of the blocking member.

According to one or more embodiments of the present disclosure, the blocking member includes a rib protruding toward the buffer area.

According to one or more embodiments of the present disclosure, the housing includes a seating portion that is formed along an entire circumference of the connection hole and the base is on the seating portion.

According to one or more embodiments of the present disclosure, the base includes a pair of protrusions, and the seating portion includes a pair of recessed portions corresponding to the pair of protrusions.

According to one or more embodiments of the present disclosure, a bottom of the seating portion is a flat surface.

According to one or more embodiments of the present disclosure, the blocking member includes an elastic material.

According to one or more embodiments of the present disclosure, the base includes a material that has a strength greater than a strength of a material of the blocking member.

According to one or more embodiments of the present disclosure, one side end of the blocking member is in contact with the second sealing member and is bent toward the connection hole, and another side end of the blocking member is in contact with the first sealing member and is bent toward the connection hole.

According to one or more embodiments of the present disclosure, the housing includes a mounting groove that is at least partially around the connection hole adjacent to the buffer area, and the mounting groove includes a shape corresponding to the blocking member such that the mounting groove is configured to receive the blocking member.

According to one or more embodiments of the present disclosure, the blocking member further includes a rib protruding toward the connection hole between the one side end and the another side end of the blocking member.

According to one or more embodiments of the present disclosure, the mounting groove of the housing further includes a rib groove into which the rib is inserted.

According to one or more embodiments of the present disclosure, the blocking member includes: one side end in contact with the second sealing member and bent toward the connection hole; and an extension portion extending a predetermined length to the buffer area in parallel with the first sealing member, and wherein the extension portion is spaced apart from the first sealing member.

According to one or more embodiments of the present disclosure, the housing includes a mounting groove that is at a portion of the buffer area, at least partially around the connection hole, and the mounting groove includes a shape corresponding to the blocking member such that the mounting groove is configured to receive the blocking member.

According to one or more embodiments of the present disclosure, the blocking member extends from one end of the first sealing member that is adjacent to the connection hole, and one end of the blocking member is in contact with the second sealing member.

BRIEF DESCRIPTION OF DRAWINGS

These and/or other aspects, features, and advantages of certain embodiments of the present disclosure will be more apparent from the following description taken in conjunction with the accompanying drawings, in which.

DETAILED DESCRIPTION

Various example embodiments of the present disclosure and terms described herein are not intended to limit the scope of the present disclosure, and the present disclosure should be understood to include various modifications, equivalents, and alternatives of the example embodiments.

In the description of the drawings, similar reference numbers may be used for similar or related components.

The singular form of a noun corresponding to an item may include one or more of the item, unless the relevant context clearly indicates otherwise.

In this document, each of phrases such as "A or B," "at least one of A and B," "at least one of A or B," "A, B, or C," "at least one of A, B, and C," "at least one of A, B, C" may include any one of the items listed together with the corresponding phrase, or any possible combination thereof.

The term "and/or" includes any element of a plurality of related described elements or a combination of a plurality of related described elements.

Terms such as "first," "second," "primary," or "secondary" may be used simply to distinguish one component from other components, and do not limit the corresponding components in other respects (e.g., importance or order).

When it is mentioned that one (e.g., first) component is "coupled" or "connected" to another (e.g., second) component with or without terms "functionally" or "communicatively", it means that the one component can be connected to the another component directly (e.g., wired), wirelessly, or through a third component.

Terms such as "include" or "have" are intended to designate the presence of features, numbers, steps, operations, components, parts, or combinations thereof described in the embodiment, but do not preclude the presence or addition of one or more other features, numbers, steps, operations, components, parts, or combination thereof.

When a component is said to be "connected," "coupled," "supported," or "in contact" with another component, this means not only cases where the components are directly connected, coupled, supported, or contacted, but also cases where the components are indirectly connected, coupled, supported, or contacted through a third component.

When a component is said to be located "on" other component, this includes not only cases where the component is in contact with the other component, but also cases where another component exits between the two components.

Hereinafter, a portable electronic device 1 according to one or more embodiments of the present disclosure will be described in detail with reference to the attached drawings.

Figure 1:
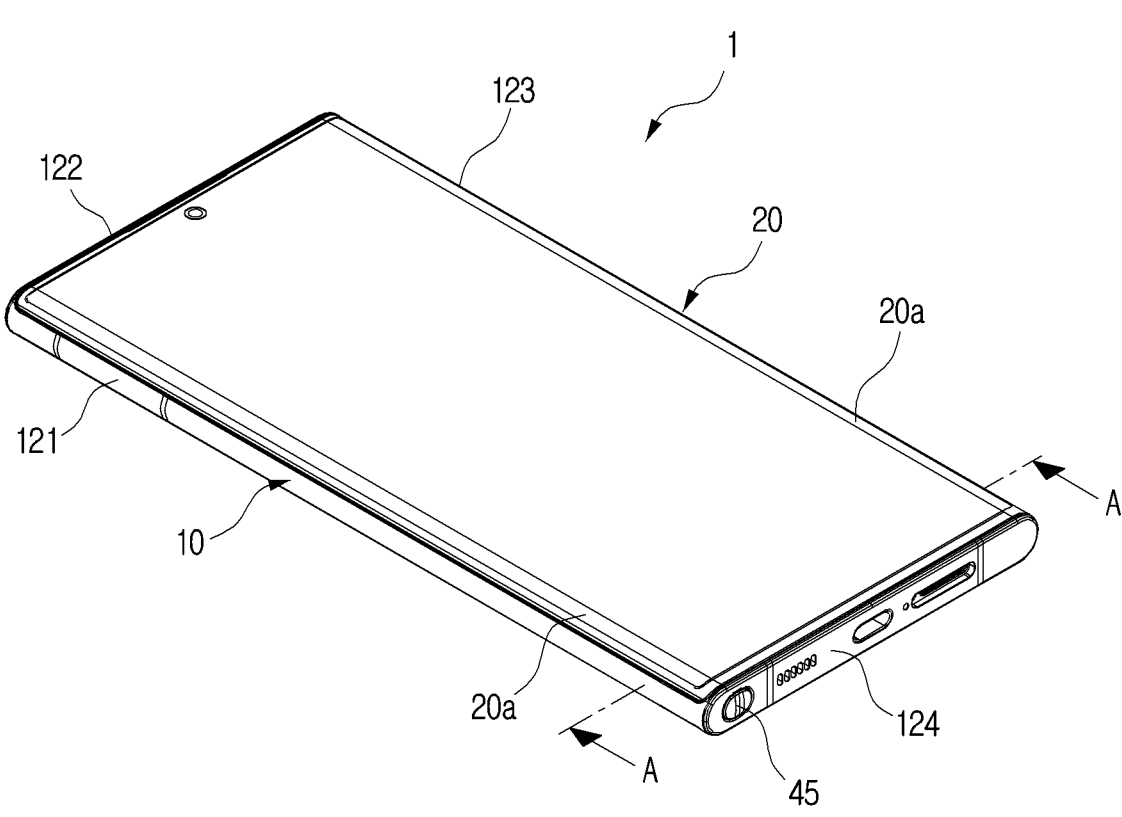
FIG. 1 is a perspective view illustrating a portable electronic device according to one or more embodiments of the present disclosure.
Figure 2:
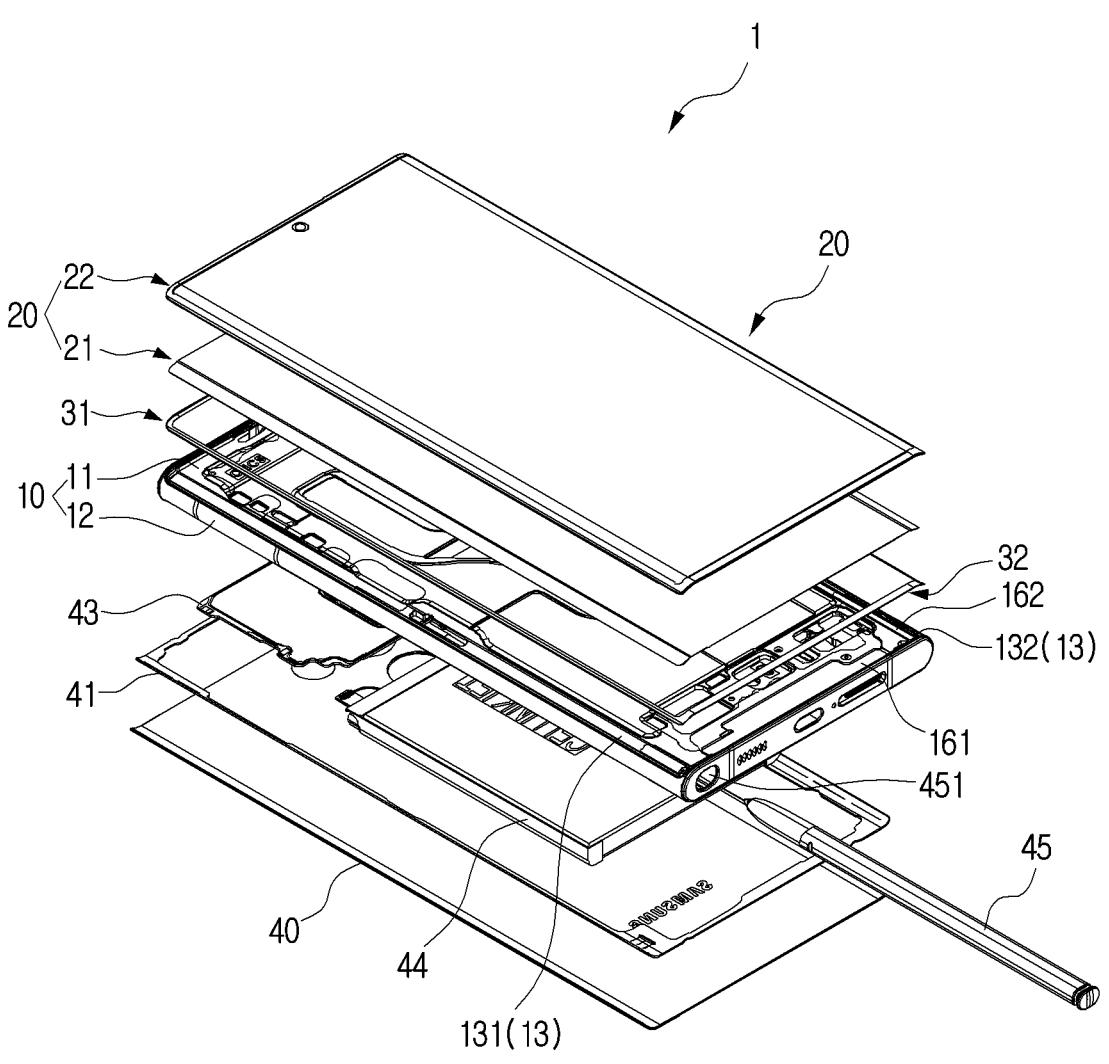
FIG. 2 is an exploded perspective view illustrating a portable electronic device according to one or more embodiments of the present disclosure.
Figure 3:
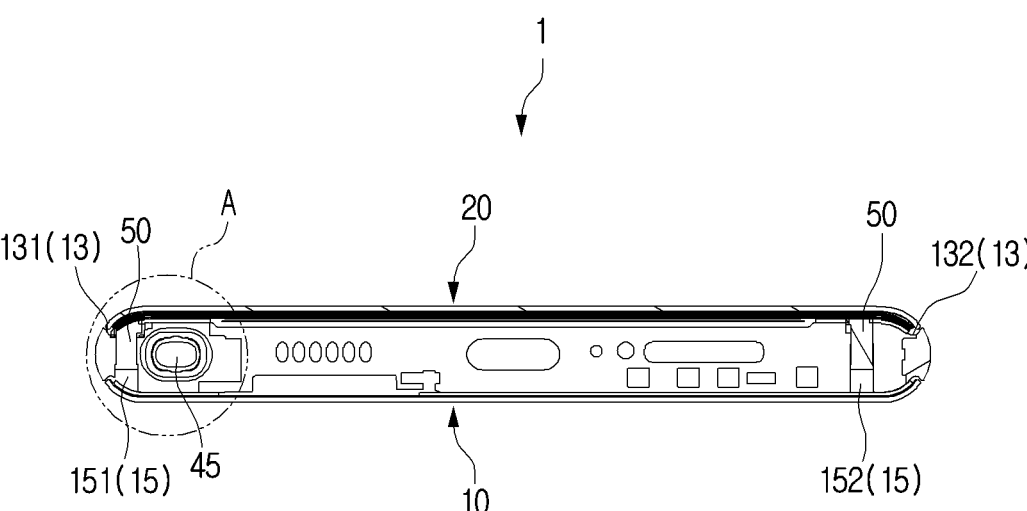
FIG. 3 is a cross-sectional view illustrating the portable electronic taken along a line A-A of FIG. 1.

FIG. 1 is a perspective view illustrating a portable electronic device 1 according to one or more embodiments of the present disclosure. FIG. 2 is an exploded perspective view illustrating a portable electronic device 1 according to one or more embodiments of the present disclosure. FIG. 3 is a cross-sectional view illustrating the portable electronic device 1 taken along line A-A of FIG. 1.

Referring to FIGS. 1 to 3, a portable electronic device 1 according to one or more embodiments of the present disclosure may include a housing 10 and a display 20.

The housing 10 may define a portion of the outer surface of the portable electronic device 1 and may include a space to accommodate and protect electronic components there inside.

The housing 10 may be formed in a substantially rectangular parallelepiped shape. The housing 10 includes a first side surface 121 having a first length, a second side surface 122 substantially perpendicular to the first side surface 121 and having a second length shorter than the first length, a third side surface 123 substantially parallel to the first side surface 121 and having the first length, and a fourth side surface 124 substantially parallel to the second side surface 122 and having the second length.

The housing 10 may include an intermediate plate 11 and a side member 12 surrounding the intermediate plate 11. The intermediate plate 11 may include a first surface and a second surface that faces a direction opposite to the first surface. The side member 12 may be formed to enclose a space between the first surface and the second surface of the intermediate plate 11.

The side member 12 may include the first side surface 121, the second side surface 122, the third side surface 123, and the fourth side surface 124.

The display 20 may be disposed on the first surface of the housing 10. In detail, the display 20 may be disposed on the first surface of the intermediate plate 11 of the housing 10.

The display 20 may include a display panel 21 and a window 22. A curved portion 20a may be formed on at least one end of the display 20. The curved portion 20a may be formed as a curved surface. The curved portion 20a may give the display 20 a three-dimensional effect. In this embodiment, the curved portion 20a may be formed on both side surfaces of the display 20. In detail, the curved portion 20a may be provided on both side surfaces of the display 20 corresponding to the first side surface 121 and the third side surface 123 of the housing 10.

The display panel 21 may be configured to display an image. The display panel 21 may include a touch sheet, a polarizing sheet, a first adhesive layer between the touch sheet and the polarizing sheet, a display layer, an electromagnetic induction panel (e.g., digitizer), and a heat dissipation sheet. The display panel 21 may include a second adhesive layer and a printed circuit board disposed in front of the touch sheet.

Both side surfaces of the display panel 21 may be bent into curved surfaces.

The window 22 may be disposed on the top surface of the display panel 21. In other words, the display panel 21 may be disposed on the rear surface of the window 22. The window 22 may be formed to support the display panel 21 and protect the display panel 21 from damage.

The window 22 may be made transparent. For example, the window 22 may be formed of glass, acrylic, or transparent plastic. The window 22 may include an opaque layer disposed at an edge of the window 22.

Both side surfaces of the window 22 may be formed as curved surfaces corresponding to the display panel 21.

The window 22 may be formed in a substantially rectangular shape to correspond to the housing 10. The window 22 may include a first edge, a second edge, a third edge, and a fourth edge corresponding to the first side surface 121, the second side surface 122, the third side surface 123, and the fourth side surface 124 of the housing 10, respectively.

The window 22 and the display panel 21 may be formed of flexible materials. When the window 22 and the display panel 21 are formed of flexible materials, a display 20 may be manufactured as a bendable display.

The housing 10 may include a buffer area 13 corresponding to the curved portion 20a of the display 20. The buffer area 13 may be formed along the edge of the housing 10. For example, the buffer area 13 may be formed along the first side surface 121 and the second side surface 122 of the housing 10. In other words, the buffer area 13 may include a first buffer area 131 formed along the first side surface 121 of the housing 10 and a second buffer area 132 formed along the third side surface 123 of the housing 10.

Referring to FIGS. 2 and 3, the buffer area 13 may be formed with a concave cross-section. For example, the buffer area 13 may be formed as a groove having a length corresponding to the curved portion 20a of the display 20 at the edge of the first surface of the housing 10 facing the display 20. The bottom surface of the buffer area 13 may be formed as a curved surface.

The buffer area 13 may accommodate the curved portion 20a of the display 20. The buffer area 13 may prevent the window 22 and the display panel 21 of the display 20 from colliding with the housing 10 and being damaged when the display 20 is assembled into the housing 10. In other words, the buffer area 13 may be formed to prevent the curved portion 20a of the display 20 from colliding with the housing 10.

Accordingly, the buffer area 13 of the housing 10 and the curved portion 20a of the display 20 may form a buffer space. The buffer space may be large enough to allow the display 20 to move when the housing 10 and the display 20 are assembled together.

The portable electronic device 1 may include at least one sealing member (e.g., a first sealing member 31 and a second sealing member 32). The at least one sealing member may be disposed between the display 20 and the housing 10. The at least one sealing member may be provided to secure the display 20 to the first surface of the intermediate plate 11 of the housing 10.

The at least one sealing member may be disposed along the edge of the display 20 and may prevent moisture, water, or dust from penetrating between the display 20 and the housing 10.

The at last one sealing member may include a first sealing member 31 and a second sealing member 32. The first sealing member 31 and the second sealing member 32 may be formed to be separated from each other.

The first sealing member 31 may be disposed between the display panel 21 and the housing 10. In other words, the display panel 21 may be attached to the housing 10 by the first sealing member 31.

The first sealing member 31 may be disposed on the rear surface of the display panel 21, that is, on the surface opposite to the front surface of the display panel 21 coupled with the window 22 along the first edge, the second edge, and the third edge of the window 22. The first sealing member 31 is disposed on the intermediate plate 11 along the first side surface 121, the second side surface 122, and the third side surface 123 of the housing 10, and causes the display panel 21 to be attached to the intermediate plate 11.

The first sealing member 31 may include an adhesive material. For example, the first sealing member 31 may be formed of tape, adhesive, waterproof dispensing, silicone, waterproof rubber, urethane, etc.

The first sealing member 31 may prevent moisture, water, or dust from penetrating between the display panel 21 and the housing 10. In detail, the first sealing member 31 may prevent moisture, water, or dust from penetrating between the display panel 21 and the first side surface 121, the second side surface 122, and the third side surface 123 of the housing 10.

The second sealing member 32 may be disposed between the window 22 and the housing 10. In other words, the window 22 may be attached to the housing 10 by the second sealing member 32. The second sealing member 32 may be disposed in the housing 10 and spaced apart from the first sealing member 31. In detail, the second sealing member 32 may be disposed on the intermediate plate 11 along the fourth side surface 124 of the housing 10. The second sealing member 32 causes the fourth edge of the window 22 to be attached to the intermediate plate 11.

The second sealing member 32 may include an adhesive material. For example, the second sealing member 32 may be formed of tape, adhesive, waterproof dispensing, silicone, waterproof rubber, urethane, etc.

The second sealing member 32 may prevent moisture, water, or dust from penetrating between the window 22 and the housing 10. In detail, the second sealing member 32 may prevent moisture, water, or dust from penetrating between the fourth edge of the window 22 and the fourth side surface 124 of the housing 10.

The portable electronic device 1 may include a flexible printed circuit board (FPCB) connected to the display panel 21. A portion of the flexible printed circuit board may be bent. When viewed from the second surface of the housing 10, a portion of the flexible printed circuit board may overlap the display panel 21. The flexible printed circuit board may be disposed along the edge of the display panel 21 corresponding to the fourth edge of the window 22.

The housing 10 may include a connection hole 15. The connection hole 15 may be formed to penetrate the housing 10 vertically. The connection hole 15 may be formed in the housing 10 to be adjacent to the buffer area 13 between the first sealing member 31 and the second sealing member 32.

The connection hole 15 may be formed at a step portion between a first part 161 of the housing 10 where the first sealing member 31 is disposed and a second part 162 of the housing 10 where the second sealing member 32 is disposed.

The connection hole 15 may include a first connection hole 151 adjacent to the first side surface 121 of the housing 10 and a second connection hole 152 adjacent to the third side surface 123 of the housing 10.

The portable electronic device 1 may include a filling member 50. The filling member 50 may be filled in the connection hole 15. The filling member 50 filled in the connection hole 15 may connect the first sealing member 31 and the second sealing member 32. When the connection hole 15 is filled with the filling member 50, the first sealing member 31 and the second sealing member 32 are connected so that moisture, water, or dust may not penetrate between the first sealing member 31 and the second sealing member 32.

The filling member 50 may be formed as a waterproof filling member that can prevent moisture or water from penetrating into the interior of the portable electronic device 1.

For example, the filling member 50 may include a cured in place gasket (CIPG). The CIPG is liquid and has high viscosity. The CIPG may harden over a period of time. Therefore, when a certain period of time passes, the CIPG may be formed into a shape corresponding to the shape of the space in which the CIPG is accommodated.

Figure 4:
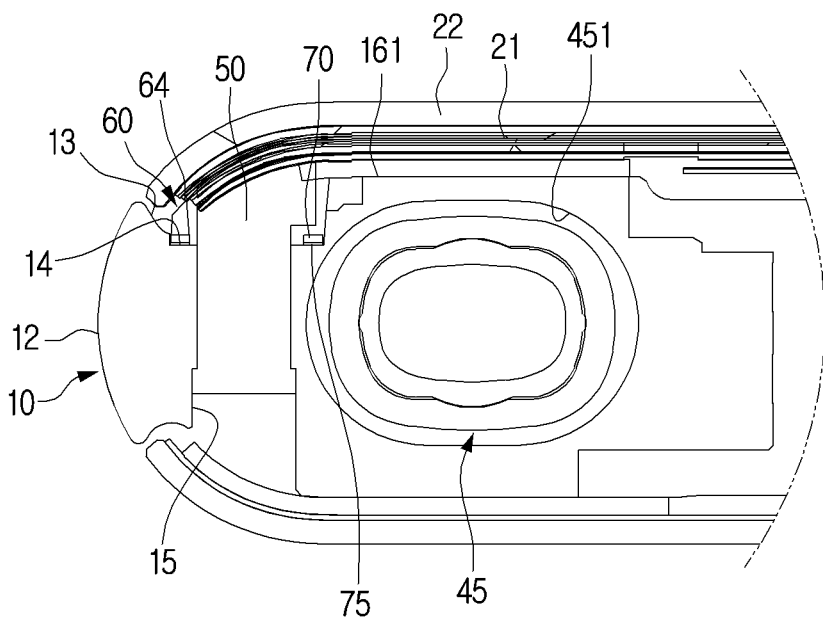
FIG. 4 is a partial enlarged cross-sectional view illustrating a part A of FIG. 3.

The portable electronic device 1 may include a blocking member 60 (see FIG. 4). The blocking member 60 may be disposed between the connection hole 15 and the buffer area 13. The blocking member 60 may be formed to block the filling member 50 from overflowing from the connection hole 15 into the buffer area 13. The blocking member 60 may be disposed at the edge of the connection hole 15.

The portable electronic device 1 may include a rear cover 40. The rear cover 40 may be disposed on the second surface of the intermediate plate 11 of the housing 10. The rear cover 40 may be attached to the second surface of the intermediate plate 11 by a rear adhesive member 41.

A printed circuit board 43 and a battery 44 may be disposed between the rear cover 40 and the housing 10.

FIG. 4 is a partial enlarged cross-sectional view illustrating a part A of FIG. 3.

Referring to FIG. 4, the connection hole 15 may be formed adjacent to the first side surface 121 (refer to FIG. 1) of the housing 10. The blocking member 60 may be disposed around the connection hole 15. The blocking member 60 may be disposed around the connection hole 15 adjacent to the buffer area 13.

The seating portion 14 may be formed around the connection hole 15. The seating portion 14 may be formed around the entire circumference of the connection hole 15. The seating portion 14 may be formed as a step portion lower than the first part 161 of the intermediate plate 11 to which the first sealing member 31 is attached. In addition, the seating portion 14 may be formed as a step portion lower than the second part 162 of the intermediate plate 11 to which the second sealing member 32 is attached. The bottom surface of the seating portion 14 may be formed as a flat surface.

A base 70 may be disposed on the lower surface of the blocking member 60. The base 70 may be positioned in the seating portion 14 provided around the connection hole 15 of the housing 10. The base 70 may be fixed to the seating portion 14 of the housing 10 with adhesive.

An upper surface 64 of the blocking member 60 may contact or be adjacent to the lower surface of the curved portion 20a of the display 20. The upper surface 64 of the blocking member 60 may be formed as a curved surface corresponding to the curved portion 20a of the display 20. The upper surface 64 of the blocking member 60 may contact or be adjacent to the window 22 and/or the display panel 21 of the display 20.

The connection hole 15 may be filled with the filling member 50. The filling member 50 may connect the first sealing member 31 and the second sealing member 32.

A stylus receiving hole 451 may be formed on one side of the connection hole 15, that is, opposite to the first side surface 121 of the housing 10. The entrance of the stylus receiving hole 451 may be provided on the fourth side surface 124 of the housing 10. A stylus 45 may be accommodated in the stylus receiving hole 451.

Figure 5:
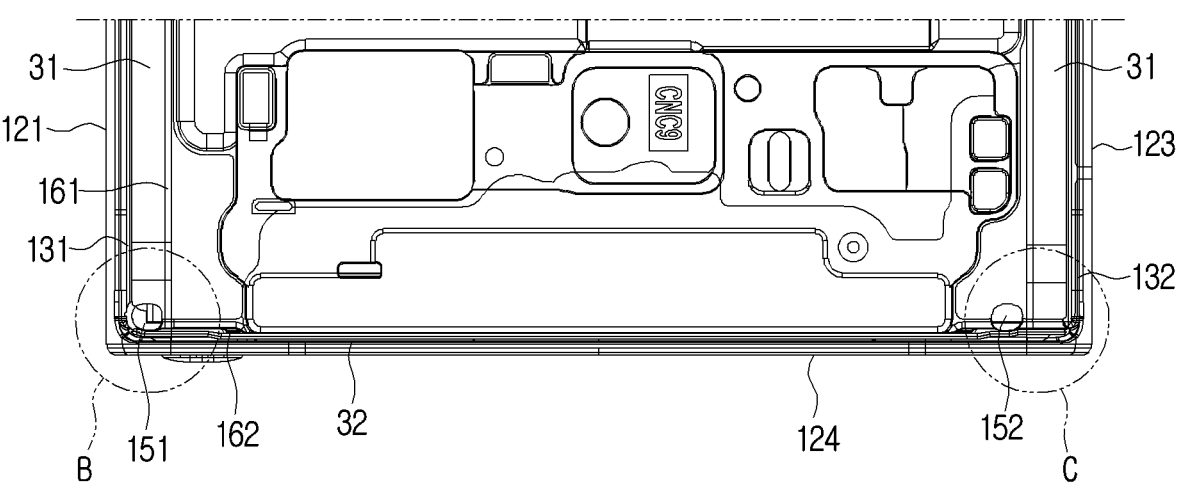
FIG. 5 is a partial plan view illustrating a portion of a housing of a portable electronic device according to one or more embodiments of the present disclosure.
Figure 6:
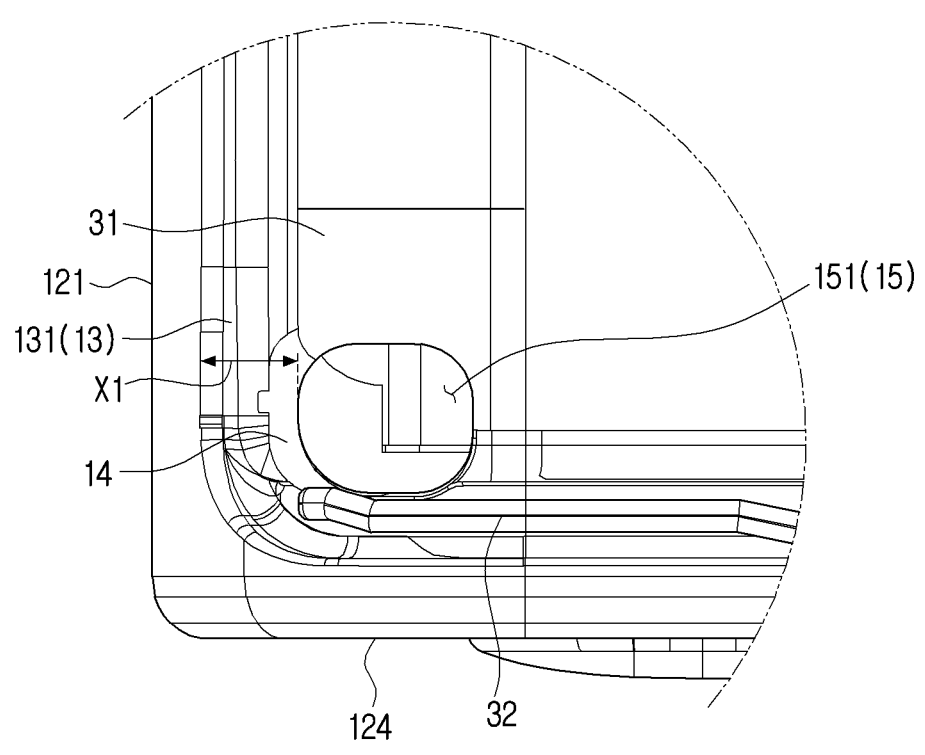
FIG. 6 is a partial enlarged plan view illustrating a part B of FIG. 5.
Figure 7:
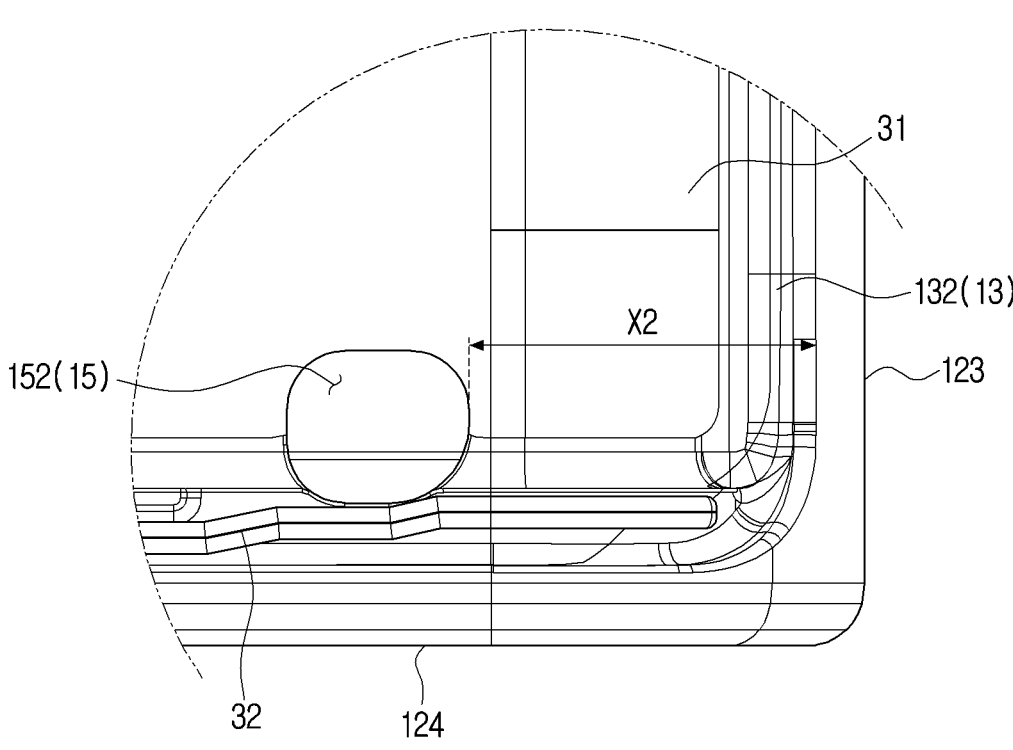
FIG. 7 is a partial enlarged plan view illustrating a part C of FIG. 5.

FIG. 5 is a partial plan view illustrating a portion of a housing 10 of a portable electronic device 1 according to one or more embodiments of the present disclosure. FIG. 6 is a partial enlarged plan view illustrating a part B of FIG. 5. FIG. 7 is a partial enlarged plan view illustrating a part C of FIG. 5. For reference, FIG. 5 shows a portion of the housing 10 adjacent to the fourth side surface 124 of the housing 10.

Referring to FIGS. 5, 6, and 7, the housing 10 is provided with two connection holes 15 adjacent to the fourth side surface 124. The connection holes 15 may include a first connection hole 151 and a second connection hole 152. The two connection holes (i.e., the first connection hole 151 and the second connection hole 152) are formed near two corners of the housing 10 and are therefore far apart from each other.

The first connection hole 151 may be formed adjacent to the first side surface 121 of the housing 10. The first connection hole 151 may be formed adjacent to the first buffer area 131 of the housing 10. The first buffer area 131 may be located between the first connection hole 151 and the first side surface 121.

The second connection hole 152 may be formed adjacent to the third side surface 123 of the housing 10. The second connection hole 152 may be formed at a predetermined distance from the second buffer area 132 of the housing 10.

The distance between the second connection hole 152 and the second buffer area 132 may be longer than the distance between the first connection hole 151 and the first buffer area 131. For example, when the distance from the first connection hole 151 to the outer surface of the first buffer area 131 is X1 and the distance from the second connection hole 152 to the outer surface of the second buffer area 132 is X2, X2>X1.

In this case, the distance (e.g., X1) between the first connection hole 151 and the first buffer area 131 is short. Thus, while filling the first connection hole 151 with the filling member 50, the filling member 50 (e.g., a liquid filling member) does not harden, and part of the filling member 50 may leak out of the housing 10 through the first buffer area 131 in a comparative embodiment.

Because the distance (e.g., X2) between the second connection hole 152 and the second buffer area 132 is long, while filling the second connection hole 152 with the filling member 50, the filling member 50 (e.g., a liquid filling member) hardens, so that part of the filling member 50 does not leak out of the housing 10 through the second buffer area 132. In other words, part of the filling member 50 flowing out of the second connection hole 152 is solidified in the groove connecting the second buffer area 132 and the second connection hole 152, and therefore does not flow to the second buffer area 132.

Accordingly, the blocking member 60 to prevent the filling member 50 from leaking out of the housing 10 may be disposed at the edge of the first connection hole 151. Because the filling member 50 filled in the second connection hole 152 does not leak out of the housing 10, the blocking member 60 may not be disposed at the edge of the second connection hole 152.

Figure 8:
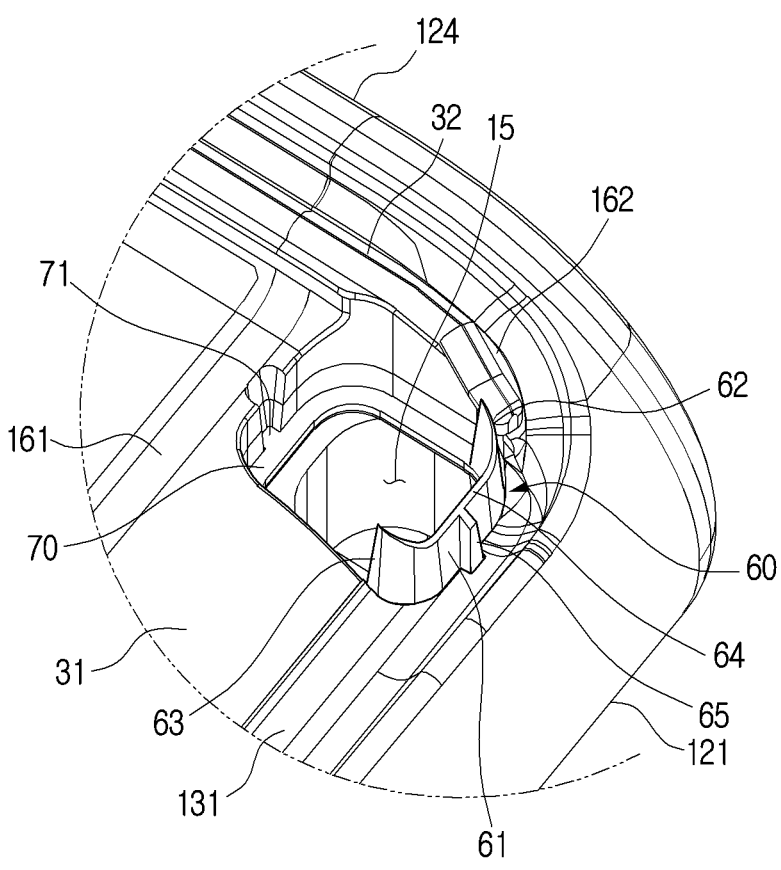
FIG. 8 is a partial enlarged perspective view illustrating a state in which a blocking member is disposed in the part B of FIG. 5.

FIG. 8 is a partial enlarged perspective view illustrating a state in which a blocking member 60 is disposed in the part B of FIG. 5.

Referring to FIG. 8, there is a step between the first part 161 of the housing 10 where the first sealing member 31 is disposed and the second part 162 of the housing 10 where the second sealing member 32 is disposed. This step is formed because of the step between the rear surface of the display panel 21 and the rear surface of the window 22. A gap exists between the first sealing member 31 and the second sealing member 32 due to the height difference between the first part 161 and the second part 162 of the housing 10.

To waterproof the portable electronic device 1, the first sealing member 31 and the second sealing member 32 may form a closed loop. To this end, the portable electronic device 1 may include a structure connecting the first sealing member 31 and the second sealing member 32 within the step portion. The connection structure connecting the first sealing member 31 and the second sealing member 32 may be formed of the filling member 50 filled in the connection hole 15. The filling member 50 fills the gap between the first sealing member 31 and the second sealing member 32 so that the first sealing member 31 and the second sealing member 32 form a closed loop.

Because the connection hole 15 is adjacent to the first buffer area 131, when filling the connection hole 15 with the filling member 50, the filling member 50 may leak out of the housing 10 through the first buffer area 131 in a comparative embodiment. To prevent this, the blocking member 60 may be disposed around the connection hole 15.

The blocking member 60 is disposed between the connection hole 15 and the first buffer area 131, and may be formed to prevent the filling member 50 injected into the connection hole 15 from flowing into the first buffer area 131.

The blocking member 60 may be disposed between the first sealing member 31 and the second sealing member 32 adjacent to the connection hole 15. The blocking member 60 may be formed to prevent the filling member 50 from leaking between the first sealing member 31 and the second sealing member 32. That is, the blocking member 60 may be formed in a shape that can block the gap or space between the first sealing member 31 and the second sealing member 32. In other words, the blocking member 60 may function to confine the filling member 50 to the connection hole 15.

Both side ends of the blocking member 60 may be in contact with the first sealing member 31 and the second sealing member 32, respectively. In detail, one side end of the blocking member 60 may be in contact with the second sealing member 32 and may be bent toward the connection hole 15. Accordingly, one side end of the blocking member 60 may be located closer to the connection hole 15 than one end of the second sealing member 32. The other side end of the blocking member 60 may be in contact with the first sealing member 31 and may be bent toward the connection hole 15. In other words, both side ends of the blocking member 60 may be bent at a predetermined curvature toward the connection hole 15. Accordingly, the other side end of the blocking member 60 may be located closer to the connection hole 15 than one end of the first sealing member 31.

As illustrated in FIG. 8, the blocking member 60 is disposed around the connection hole 15, so that when the filling member 50 is injected into the connection hole 15, the filling member 50 may be prevented from flowing into the first buffer area 131 through the gap between the first sealing member 31 and the second sealing member 32.

Hereinafter, the blocking member 60 according to one or more embodiments of the present disclosure will be described in detail with reference to FIGS. 9, 10, and 11.

Figure 9:
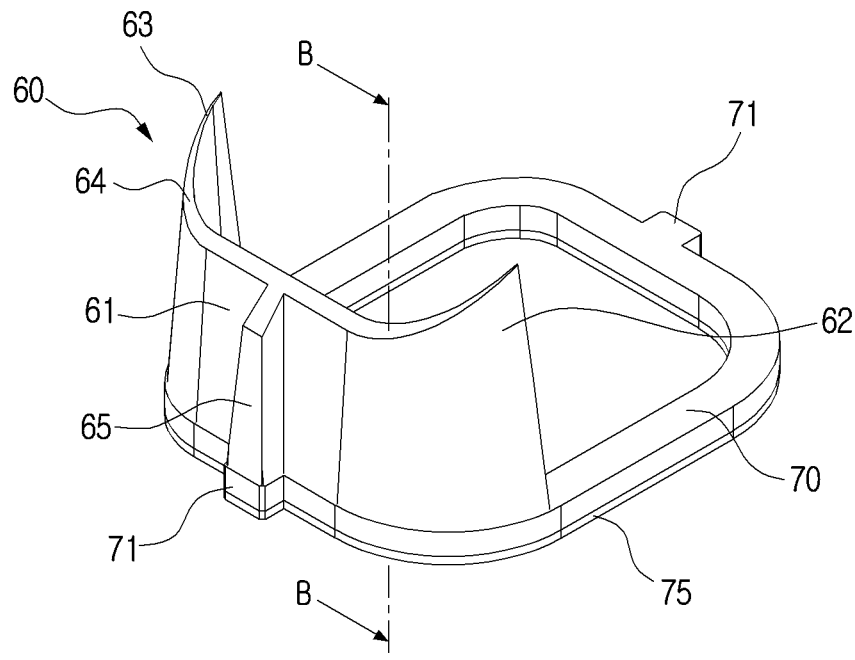
FIG. 9 is a perspective view illustrating a blocking member used in a portable electronic device according to one or more embodiments of the present disclosure.

FIG. 9 is a perspective view illustrating a blocking member 60 used in a portable electronic device 1 according to one or more embodiments of the present disclosure. FIG. 10 is a cross-sectional view illustrating the blocking member 60 taken along line B-B of FIG. 9. FIG. 11 is a view illustrating a base 70 of the blocking member 60 of FIG. 9.

Referring to 9, the blocking member 60 may be formed in a substantially plate shape. For example, the blocking member 60 may include a flat portion 61 having a flat plate shape and bent portions extending toward the rear of the blocking member 60 from both sides of the flat portion 61. In other words, the blocking member 60 may be formed in a substantially U-shape with a flat bottom and a wide width. Here, the rear of the blocking member 60 refers to the direction toward the connection hole 15 when the blocking member 60 is disposed in the housing 10.

One side end 62 of the blocking member 60 is in contact with the second sealing member 32 and is bent at a predetermined curvature toward the connection hole 15. The other side end 63 of the blocking member 60 is in contact with the first sealing member 31 and is bent at a predetermined curvature toward the connection hole 15. Both the one side end 62 and the other side end 63 of the blocking member 60 may be bent such as to have the same curvature.

Because the one side end 62 of the blocking member 60 is in contact with the second sealing member 32 and the other side end 63 of the blocking member 60 is in contact with the first sealing member 31, the filling member 50 filling the connection hole 15 may be blocked from flowing into the first buffer area 131.

When the housing 10 and the display 20 are assembled, the blocking member 60 comes into contact with the display 20. Therefore, in order to prevent or reduce the impact of the blocking member 60 on the display 20 when the housing 10 and the display 20 are coupled, the blocking member 60 may be formed of an elastic material. In other words, the blocking member 60 may be formed of a material having elasticity that minimizes or does not cause impact to the display 20. For example, the blocking member 60 may be formed of sponge.

In addition, the upper surface 64 of the blocking member 60 may be formed as a curved surface corresponding to the curved portion 20a of the display panel 21. In the case that the blocking member 60 is disposed around the connection hole 15, when the housing 10 and the display 20 are coupled, the curved portion 20a of the display 20 may come into contact with the blocking member 60. In detail, when coupling the housing 10 and the display 20, the curved portion 20a of the display 20, that is, the rear surface of the curved portion of the display panel 21 may come into contact with the upper surface 64 of the blocking member 60. In this case, when the upper surface 64 of the blocking member 60 is formed as a curved surface corresponding to the rear surface of the curved portion of the display panel 21, the impact applied to the display 20 by the blocking member 60 may be prevented or minimized.

Figure 10:
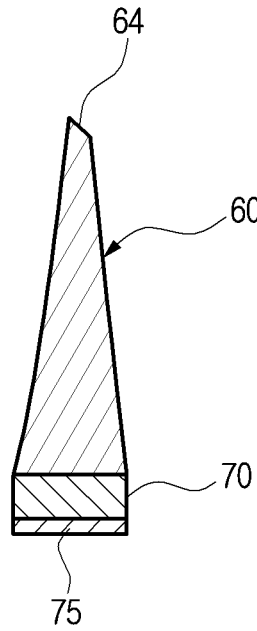
FIG. 10 is a cross-sectional view illustrating the blocking member taken along line B-B of FIG. 9.
Figure 11:
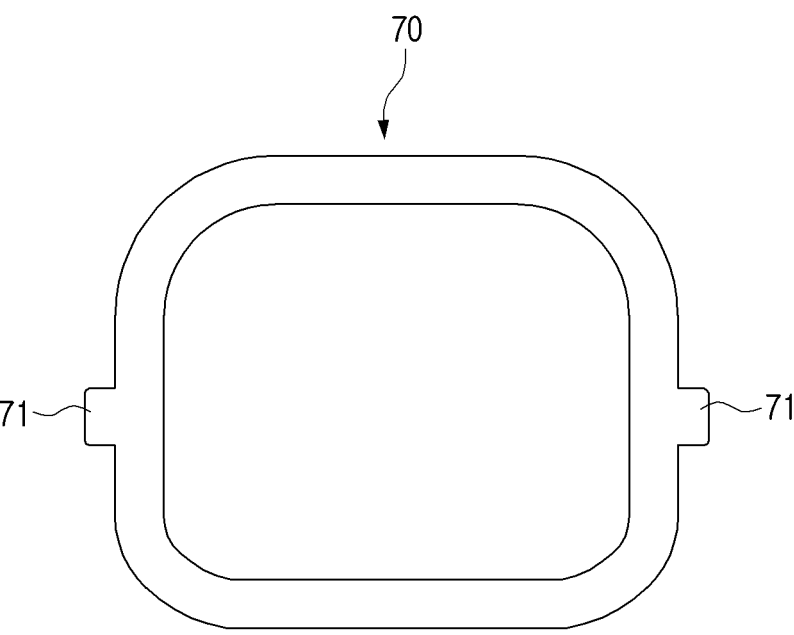
FIG. 11 is a view illustrating a base of the blocking member of FIG. 9.

In addition, as illustrated in FIG. 10, the blocking member 60 may be formed in a shape that gradually becomes thinner from bottom to top. In detail, the blocking member 60 may be formed so that the thickness of the blocking member 60 gradually decreases from the bottom surface to the upper surface 64 of the blocking member 60. In other words, the thickness of the bottom surface of the blocking member 60 may be the thickest part of the blocking member 60, and the thickness of the upper surface 64 of the blocking member 60 may be the thinnest part of the blocking member 60.

In this way, by thinning the thickness of the upper surface 64 of the blocking member 60, the contact area between the blocking member 60 and the display panel 21 may be reduced, so that the elastic force applied by the blocking member 60 to the display 20 may be reduced. In addition, because the lower portion of the blocking member 60 is thicker than the upper portion thereof, the blocking member 60 may secure strength.

The blocking member 60 may include a rib 65. The rib 65 may be provided to reinforce the strength of the blocking member 60. The rib 65 may be disposed on the front surface of the blocking member 60. In other words, the rib 65 may be to protrude from the blocking member 60 toward the first buffer area 131 (see FIG. 8). Here, the front surface of the blocking member 60 refers to the surface facing the first buffer area 131 of the housing 10 in the opposite direction to the rear of the blocking member 60. The rib 65 may be formed at the middle of the flat portion 61 of the blocking member 60. The rib 65 may be formed on the front surface of the blocking member 60 in a vertical direction.

The rib 65 may be formed so as not to contact with the display panel 21. In other words, the top of the rib 65 may be formed to have a downward slope so that when the housing 10 and the display 20 are assembled, the top of the rib 65 does not contact the rear surface of the display panel 21.

The blocking member 60 may be attached to a base 70. The base 70 may be disposed on a lower surface of the blocking member 60. The base 70 may be formed to facilitate installation of the blocking member 60 around the connection hole 15.

The base 70 may be formed in a closed loop shape surrounding the circumference of the connection hole 15. For example, the base 70 may be formed in a substantially rectangular frame shape. The central opening of the base 70 may communicate with the connection hole 15. The upper and lower surfaces of the base 70 may be formed as flat surfaces.

The blocking member 60 may be disposed on one side of the upper surface of the base 70. For example, the blocking member 60 may be disposed on the upper surface of one side of the base 70, which is formed in a substantially rectangular shape.

The blocking member 60 may be attached to the base 70 with an adhesive, for example, a double-sided tape. Alternatively, the blocking member 60 and the base 70 may be formed integrally.

The base 70 may include a pair of protrusions 71. The pair of protrusions 71 may be formed to protrude outward from the outer circumferential surface of the base 70. The pair of protrusions 71 may be arranged at 180-degree intervals. One of the pair of protrusions 71 may be formed to correspond to the rib 65 of the blocking member 60.

The base 70 may be formed of a material having a strength greater than a strength of the blocking member 60 so as to reinforce the strength of the blocking member 60. In other words, the base 70 may be formed of a material harder than a material of the blocking member 60.

A seating portion 14 (see FIG. 12) on which the base 70 is disposed may be provided around the connection hole 15 of the housing 10. Hereinafter, the seating portion 14 of the housing 10 where the base 70 of the blocking member 60 is disposed will be described in detail with reference to FIG. 12.

Figure 12:
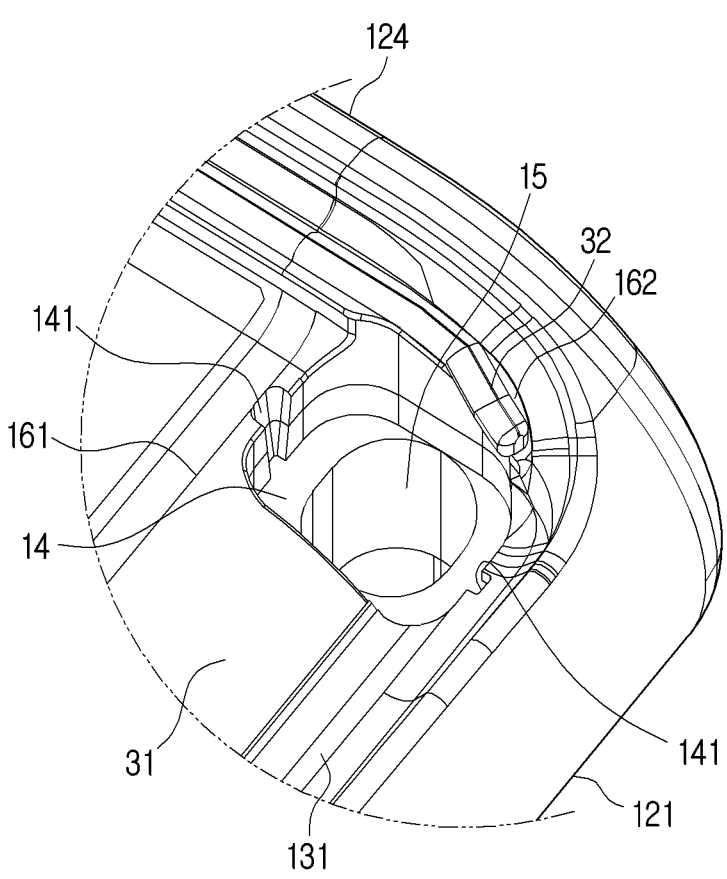
FIG. 12 is a partial perspective view illustrating a seating portion of a portable electronic device according to one or more embodiments of the present disclosure.

FIG. 12 is a partial perspective view illustrating a seating portion 14 of a portable electronic device 1 according to one or more embodiments of the present disclosure.

Referring to FIG. 12, the housing 10 includes the connection hole 15. The connection hole 15 is formed between the first part 161 of the housing 10 where the first sealing member 31 is disposed and the second part 162 of the housing 10 where the second sealing member 32 is disposed.

The seating portion 14 is provided around the connection hole 15. The seating portion 14 is formed along the entire circumference of the connection hole 15. The bottom of the connection hole 15 may be formed as a flat surface. The seating portion 14 may form a step with the connection hole 15.

In addition, the seating portion 14 may be formed to be stepped at a predetermined depth on the upper surface of the housing 10. There is a height difference between the first part 161 and the second part 162 of the housing 10, so the height from the first part 161 to the bottom of the seating portion 14 may be different from the height from the second part 162 to the bottom of the seating portion 14.

Because the bottom of the seating portion 14 is flat, the lower surface of the base 70, which is formed as a plane, may be stably disposed on the bottom of the seating portion 14. The base 70 of the blocking member 60 may be attached to the seating portion 14 by an adhesive, for example, double-sided tape 75 (see FIGS. 4 and 9).

The seating portion 14 may include a pair of recessed portions 141. The pair of recessed portions 141 may be formed to correspond to the pair of protrusions 71 of the base 70. Accordingly, when the base 70 is disposed on the seating portion 14, the pair of protrusions 71 of the base 70 may be inserted into the pair of recessed portions 141 of the seating portion 14. When the pair of protrusions 71 of the base 70 are inserted into the pair of recessed portions 141 of the seating portion 14, the base 70 may be stably fixed to the seating portion 14.

Hereinafter, the blocking member 60 of the portable electronic device 1 according to one or more embodiments of the present disclosure will be described with reference to FIGS. 13 to 20.

Figure 13:
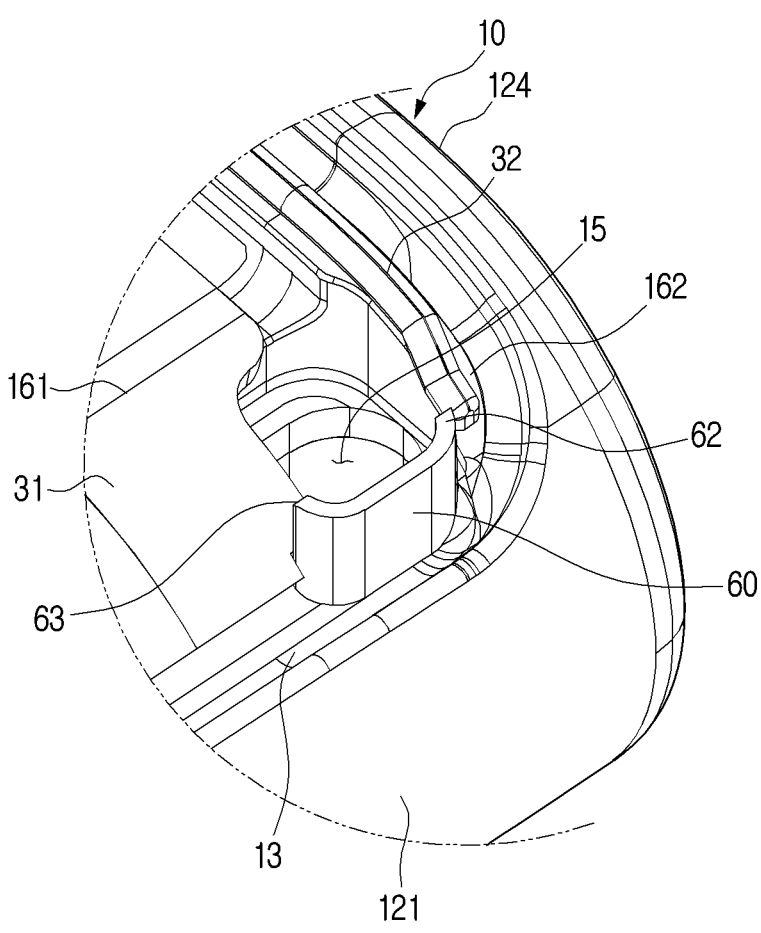
FIG. 13 is a partial perspective view illustrating a blocking member of a portable electronic device according to one or more embodiments of the present disclosure.
Figure 14:
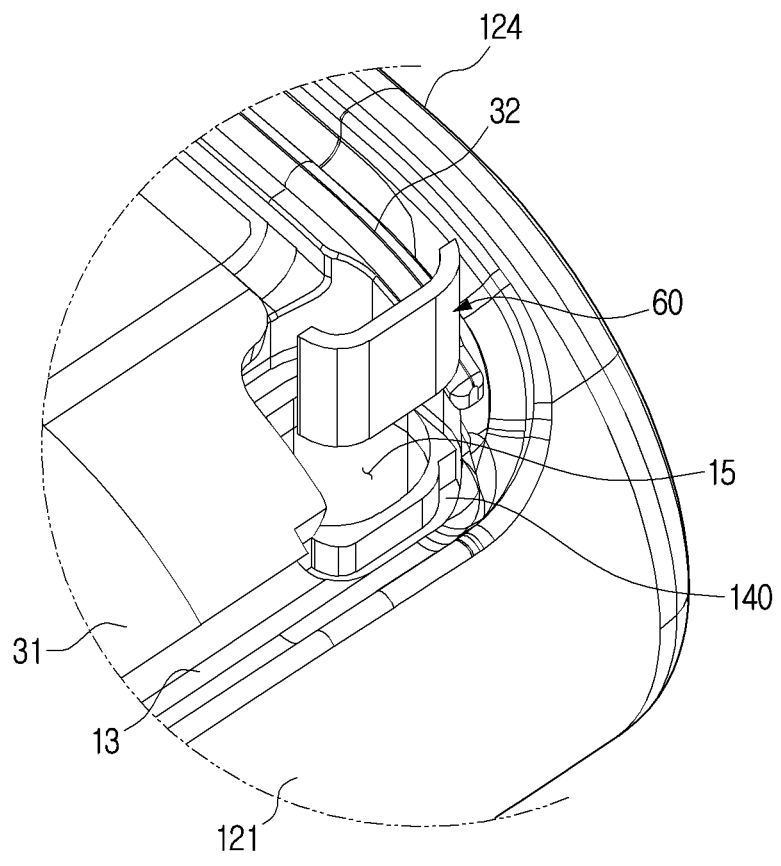
FIG. 14 is a partial perspective view illustrating a state in which the blocking member is separated from the portable electronic device of FIG. 13.
Figure 15:
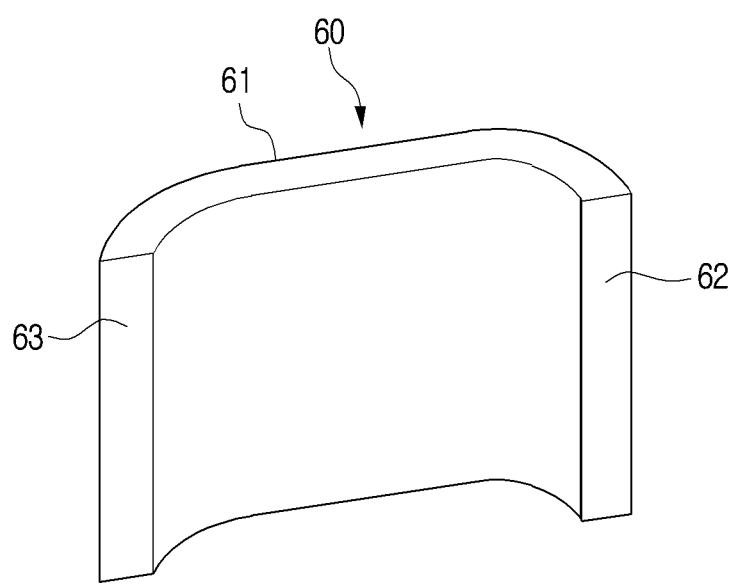
FIG. 15 is a perspective view illustrating the blocking member of FIG. 13.

FIG. 13 is a partial perspective view illustrating a blocking member 60 of a portable electronic device 1 according to one or more embodiments of the present disclosure. FIG. 14 is a partial perspective view illustrating a state in which the blocking member 60 is separated from the portable electronic device 1 of FIG. 13. FIG. 15 is a perspective view illustrating the blocking member 60 of FIG. 13.

Referring to FIGS. 13 and 14, the housing 10 includes the connection hole 15. The connection hole 15 is formed between the first part 161 of the housing 10 where the first sealing member 31 is disposed and the second part 162 of the housing 10 where the second sealing member 32 is disposed.

The blocking member 60 may be disposed between the connection hole 15 and the buffer area 13. In other words, the blocking member 60 is disposed around the connection hole 15 adjacent to the buffer area 13. The blocking member 60 may prevent the filling member 50 from flowing into the buffer area 13 through the gap between the first sealing member 31 and the second sealing member 32.

Referring to FIG. 15, the blocking member 60 may be formed in a plate shape. For example, the blocking member 60 may include a flat portion 61 having a flat plate shape and a pair of bent portions extending toward the rear of the blocking member 60 from both sides of the flat portion 61. In other words, the blocking member 60 may be formed in a substantially U-shape with a flat bottom and a wide width.

One side end 62 of the blocking member 60 may be in contact with the second sealing member 32, and may be formed as a curved surface bent at a predetermined curvature toward the connection hole 15. The other side end 63 of the blocking member 60 may be in contact with the first sealing member 31 and may be formed as a curved surface bent at a predetermined curvature toward the connection hole 15. Both side ends (e.g., the one side end 62 and the other side end 63) of the blocking member 60 may be bent such as to have the same curvature.

Because the one side end 62 of the blocking member 60 is in contact with the second sealing member 32 and the other side end 63 of the blocking member 60 is in contact with the first sealing member 31, the filling member 50 in the connection hole 15 may be blocked from flowing into the buffer area 13.

A mounting groove 140 may be formed around the connection hole 15 of the housing 10. The mounting groove 140 may be provided around the connection hole 15 adjacent to the buffer area 13. The mounting groove 140 may be formed in a shape corresponding to the blocking member 60 so that the blocking member 60 is inserted into the mounting groove 140. The mounting groove 140 may be formed to have a predetermined depth, so that the lower end portion of the blocking member 60 is inserted into the mounting groove 140 and the blocking member 60 is fixed to the housing 10. The depth of the mounting groove 140 may be determined so that the blocking member 60 is vertically fixed to the upper surface of the housing 10.

Figure 16:
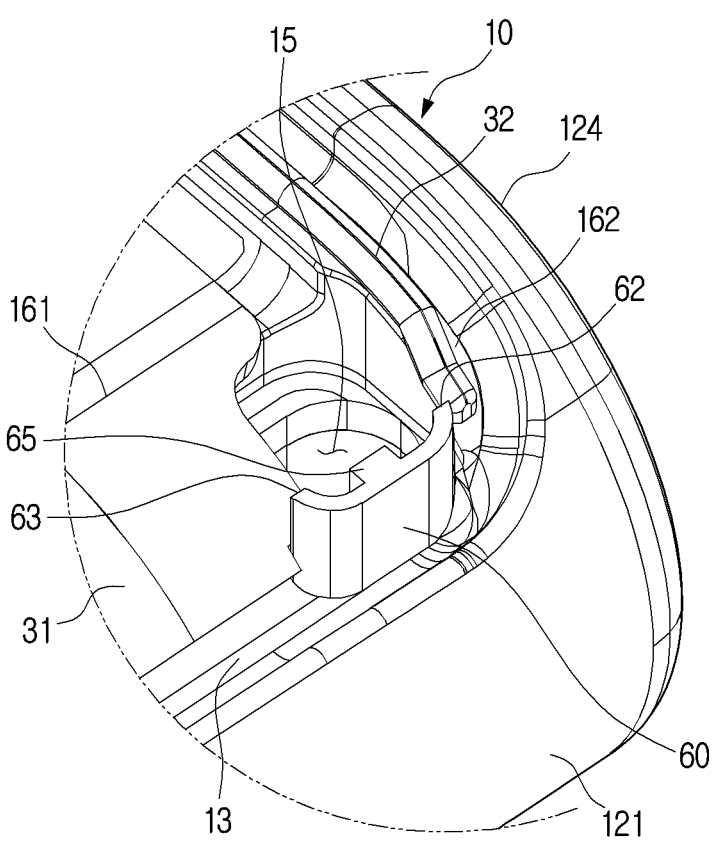
FIG. 16 is a partial perspective view illustrating a blocking member of a portable electronic device according to one or more embodiments of the present disclosure.
Figure 17:
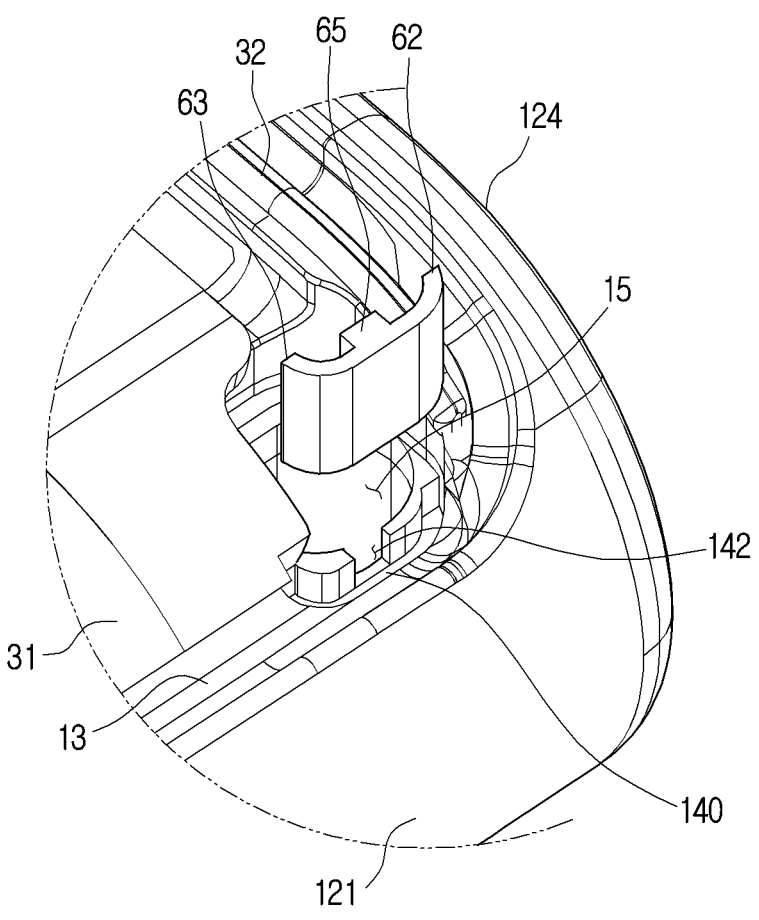
FIG. 17 is a partial perspective view illustrating a state in which the blocking member is separated from the portable electronic device of FIG. 16.
Figure 18:
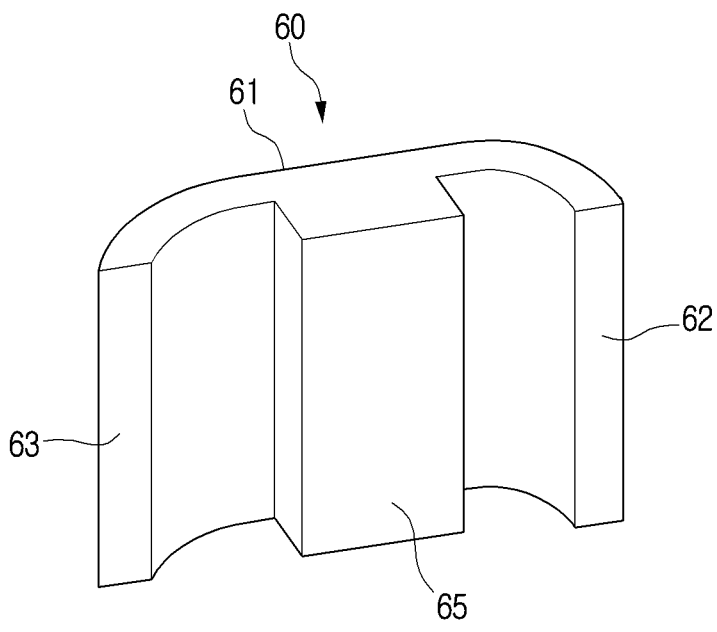
FIG. 18 is a perspective view illustrating the blocking member of FIG. 16.

FIG. 16 is a partial perspective view illustrating a blocking member 60 of a portable electronic device 1 according to one or more embodiments of the present disclosure. FIG. 17 is a partial perspective view illustrating a state in which the blocking member 60 is separated from the portable electronic device 1 of FIG. 16. FIG. 18 is a perspective view illustrating the blocking member 60 of FIG. 16.

Referring to FIGS. 16 and 17, the housing 10 includes the connection hole 15. The connection hole 15 is formed between the first part 161 of the housing 10 where the first sealing member 31 is disposed and the second part 162 of the housing 10 where the second sealing member 32 is disposed.

The blocking member 60 may be disposed between the connection hole 15 and the buffer area 13. In other words, the blocking member 60 is disposed around the connection hole 15 adjacent to the buffer area 13. The blocking member 60 may prevent the filling member 50 from flowing into the buffer area 13 through the gap between the first sealing member 31 and the second sealing member 32.

Referring to FIG. 18, the blocking member 60 may be formed in a plate shape. For example, the blocking member 60 may include a flat portion 61 having a flat plate shape and a pair of bent portions extending toward the rear of the blocking member 60 from both sides of the flat portion 61. In other words, the blocking member 60 may be formed in a substantially U-shape with a flat bottom and a wide width.

One side end 62 of the blocking member 60 may be in contact with the second sealing member 32, and may be formed as a curved surface bent at a predetermined curvature toward the connection hole 15. The other side end 63 of the blocking member 60 may be in contact with the first sealing member 31 and may be formed as a curved surface bent at a predetermined curvature toward the connection hole 15. Both side ends (i.e., the one side end 62 and the other side end 63) of the blocking member 60 may be bent such as to have the same curvature.

Because the one side end 62 of the blocking member 60 is in contact with the second sealing member 32 and the other side end 63 of the blocking member 60 is in contact with the first sealing member 31, the filling member 50 in the connection hole 15 may be blocked from flowing into the buffer area 13.

The blocking member 60 may include a rib 65. The rib 65 may be formed on the flat portion 61 of the blocking member 60. The rib 65 is formed to protrude toward the connection hole 15 between the one side end 62 and the other side end 63. The rib 65 may be formed at the middle of the blocking member 60. The rib 65 may be formed to extend in the height direction of the blocking member 60.

A mounting groove 140 may be formed around of the connection hole 15 of the housing 10. The mounting groove 140 may be provided around the connection hole 15 adjacent to the buffer area 13. The mounting groove 140 may be formed in a shape corresponding to the blocking member 60 so that the blocking member 60 is inserted into the mounting groove 140. The mounting groove 140 may be formed to have a predetermined depth so that the lower end portion of the blocking member 60 is inserted into the mounting groove 140 and the blocking member 60 is fixed to the housing 10. The depth of the mounting groove 140 may be determined so that the blocking member 60 is vertically fixed to the upper surface of the housing 10.

The mounting groove 140 may include a rib groove 142 into which the rib 65 of the blocking member 60 is inserted. In other words, the rib groove 142 may be formed in the middle of the mounting groove 140. The rib groove 142 may be formed concavely from the mounting groove 140 toward the connection hole 15.

When the rib 65 is formed on the blocking member 60, the strength of the blocking member 60 may be increased. Additionally, when the rib groove 142 is provided in the mounting groove 140, the blocking member 60 may be stably fixed to the housing 10.

Figure 19:
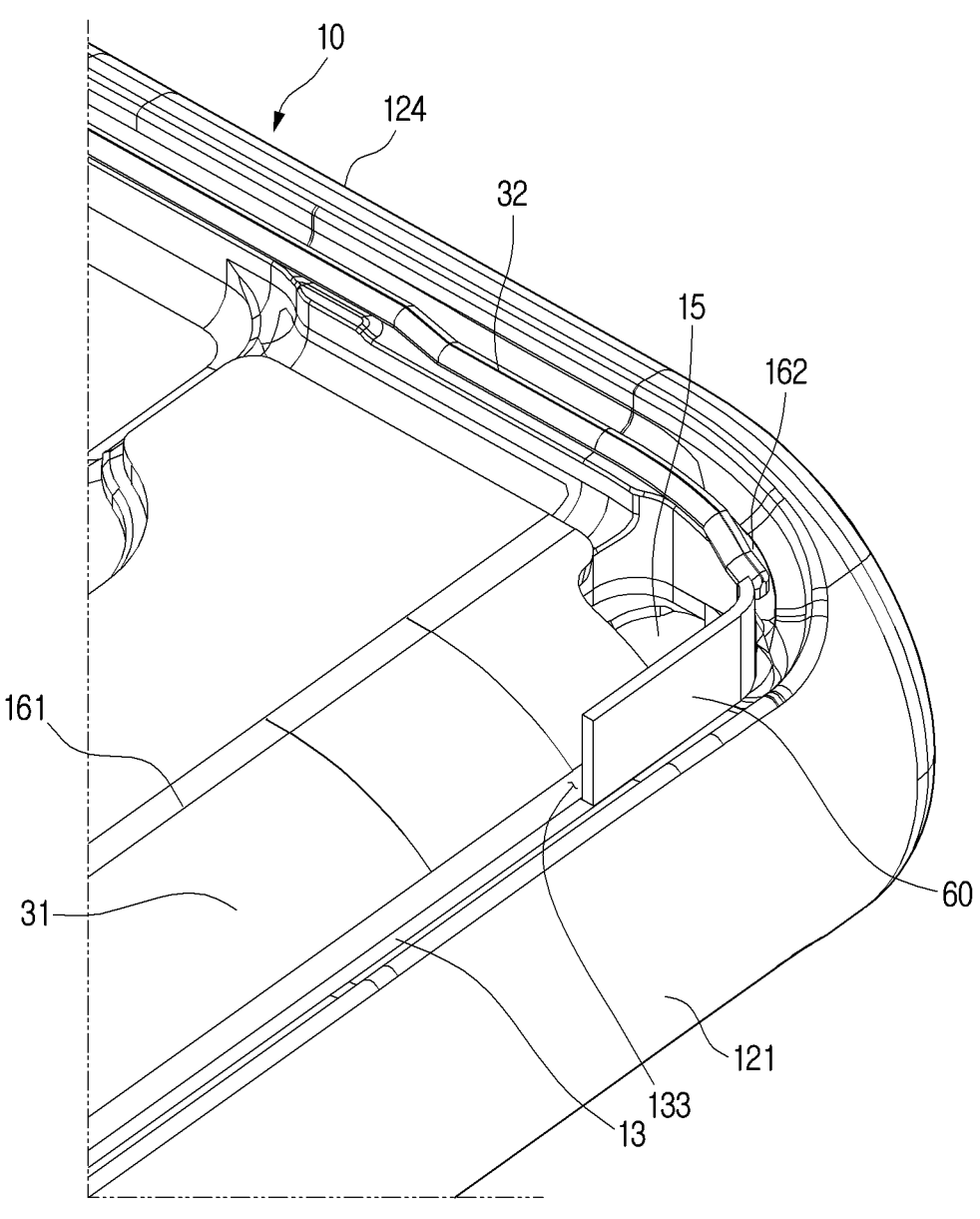
FIG. 19 is a partial perspective view illustrating a blocking member of a portable electronic device according to one or more embodiments of the present disclosure.
Figure 20:
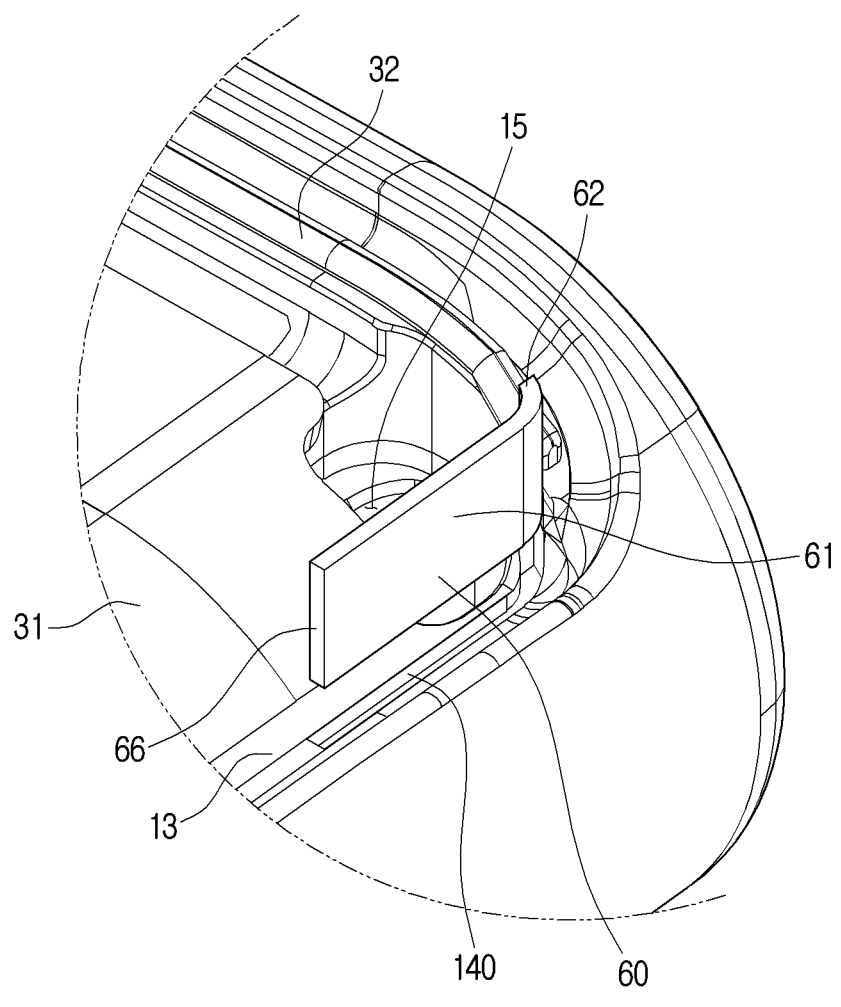
FIG. 20 is a partial perspective view illustrating a state in which the blocking member is separated from the portable electronic device of FIG. 19.

FIG. 19 is a partial perspective view illustrating a blocking member 60 of a portable electronic device 1 according to one or more embodiments of the present disclosure. FIG. 20 is a partial perspective view illustrating a state in which the blocking member 60 is separated from the portable electronic device 1 of FIG. 19.

Referring to FIGS. 19 and 20, the housing 10 includes the connection hole 15. The connection hole 15 is formed between the first part 161 of the housing 10 where the first sealing member 31 is disposed and the second part 162 of the housing 10 where the second sealing member 32 is disposed.

The blocking member 60 may be disposed between the connection hole 15 and the buffer area 13. In other words, the blocking member 60 is disposed around the connection hole 15 adjacent to the buffer area 13. The blocking member 60 may prevent the filling member 50 from flowing into the buffer area 13 through the gap between the first sealing member 31 and the second sealing member 32.

Referring to FIGS. 19-20, the blocking member 60 may be formed in a plate shape. For example, the blocking member 60 may include a flat portion 61 having a flat plate shape, a bent portion extending from one side of the flat portion 61 toward the rear of the blocking member 60, and an extension portion 66 extending from the other side of the flat portion 61.

One side end 62 of the blocking member 60, that is, the bent portion, may be in contact with the second sealing member 32 and may be bent at a predetermined curvature toward the connection hole 15. The one side end 62 of the blocking member 60 may be located closer to the connection hole 15 than one end of the second sealing member 32. Accordingly, the filling member 50 does not leak between the one side end 62 of the blocking member 60 and the second sealing member 32.

The extension portion 66 of blocking member 60 may be formed parallel to the first sealing member 31. The extension portion 66 of the blocking member 60 is spaced apart from the first sealing member 31 and may extend into the buffer area 13 by a certain length. Accordingly, a trench 133 may be formed between the extension portion 66 of the blocking member 60 and one end of the first sealing member 31. The filling member 50 may flow through the trench 133 between the extension portion 66 of the blocking member 60 and the first sealing member 31.

Because the one side end 62 of the blocking member 60 is blocked by contacting the second sealing member 32 and the trench 133 is formed between the extension portion 66 of the blocking member 60 and the first sealing member 31, the filling member 50 in the connection hole 15 may flow into the buffer area 13 through the trench 133 between the extension portion 66 of the blocking member 60 and the first sealing member 31. Because the filling member 50 is solidified while flowing along the trench 133, the filling member 50 does not leak out of the housing 10.

A mounting groove 140 may be formed at the edge of the connection hole 15 of the housing 10. The mounting groove 140 may be provided at the edge of the connection hole 15 adjacent to the buffer area 13. The mounting groove 140 may be formed in a shape corresponding to the blocking member 60 so that the blocking member 60 is inserted into the mounting groove 140. Accordingly, the mounting groove 140 may be extend for a predetermined length along the buffer area 13 to correspond to the extension portion 66 of the blocking member 60.

The mounting groove 140 may be formed to have a predetermined depth so that the lower end portion of the blocking member 60 is inserted into the mounting groove 140 and the blocking member 60 is fixed to the housing 10. The depth of the mounting groove 140 may be determined so that the blocking member 60 is vertically fixed to the upper surface of the housing 10.

In the above description, the blocking member is formed separately from the sealing member. However, as another example, the blocking member may be formed integrally with the sealing member. Hereinafter, a case where the blocking member is integrated with the sealing member will be described with reference to FIG. 21.

Figure 21:
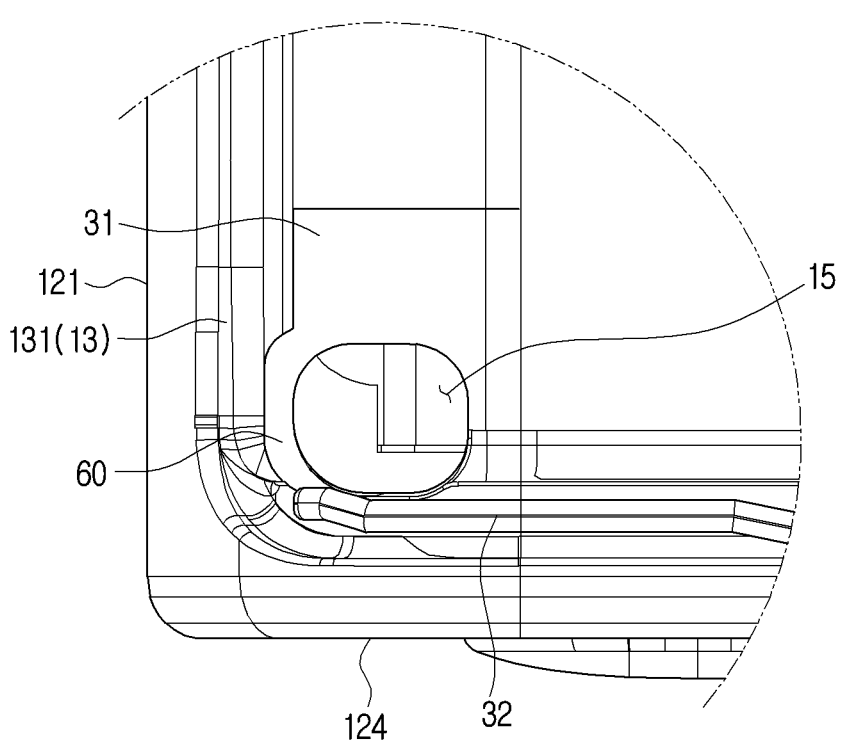
FIG. 21 is a partial view illustrating a blocking member of a portable electronic device according to one or more embodiments of the present disclosure.

FIG. 21 is a partial view illustrating a blocking member 60 of a portable electronic device 1 according to one or more embodiments of the present disclosure.

The housing 10 includes the connection hole 15. The connection hole 15 is formed between the first part 161 of the housing 10 where the first sealing member 31 is disposed and the second part 162 of the housing 10 where the second sealing member 32 is disposed.

The blocking member 60 may be disposed between the connection hole 15 and the buffer area 13. In other words, the blocking member 60 is disposed around the connection hole 15 adjacent to the buffer area 13. The blocking member 60 may prevent the filling member 50 from flowing into the buffer area 13 through the gap between the first sealing member 31 and the second sealing member 32.

The blocking member 60 may extend from one end of the first sealing member 31 adjacent to the connection hole 15. The blocking member 60 may be formed so that one end of the blocking member 60 is connected to the first sealing member 31 and the other end thereof is in contact with the second sealing member 32. The blocking member 60 is formed to block the filling member 50 from flowing into the buffer area 13. The blocking member 60 may be formed integrally with the first sealing member 31. In other words, the blocking member 60 may be formed as an extended portion of the first sealing member 31 extending from one end of the first sealing member 31 to surround a portion of the connection hole 15 facing the buffer area 13.

As described above, because the portable electronic device 1 according to one or more embodiments of the present disclosure has the blocking member 60 disposed around the connection hole 15, when the filling member 50 is injected into the connection hole 15, the filling member 50 may be prevented from leaking out of the housing 10 through the buffer area 13.

Hereinafter, a case where the blocking member 60 according to one or more embodiments of the present disclosure is not disposed around the connection hole 15 of the housing 10 will be described with reference to FIG. 22.

Figure 22:
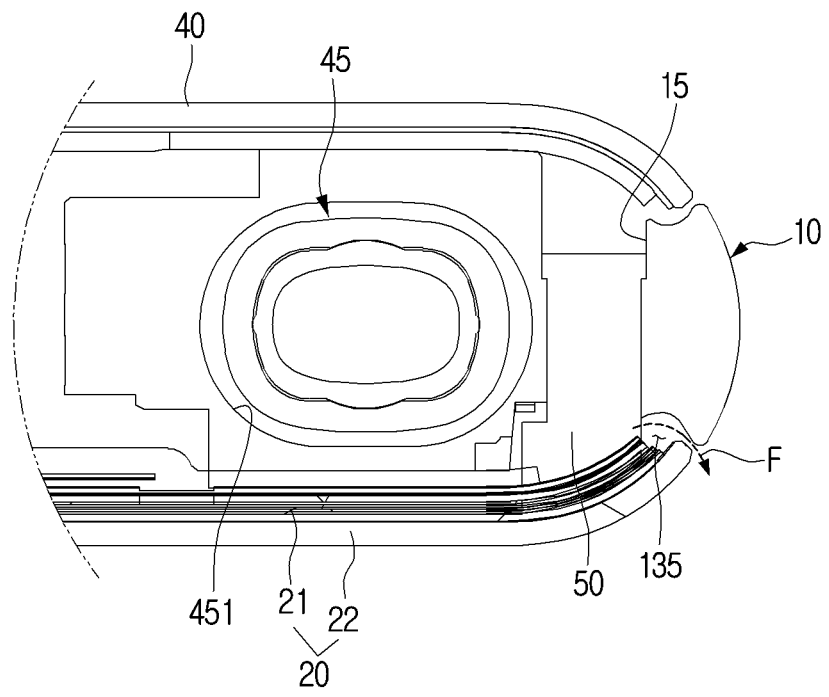
FIG. 22 is a partial cross-sectional view illustrating a state in which a filling member is leaking when filling a connection hole of a portable electronic device without a blocking member according to one or more embodiments of the present disclosure with the filling member.

FIG. 22 is a partial cross-sectional view illustrating a state in which a filling member 50 is leaking when filling a connection hole 15 of a portable electronic device without a blocking member 60 according to one or more embodiments of the present disclosure.

Referring to FIG. 22, the housing 10 includes the connection hole 15 formed adjacent to the first side surface. The filling member 50 for connecting the first sealing member 31 and the second sealing member 32 may be injected into the connection hole 15.

The filling member 50 may be injected into the connection hole 15 when the portable electronic device 1 is turned over, that is, with the display 20 positioned below.

A buffer space 135 is provided between the housing 10 and the curved portion 20*a* of the display 20 to prevent the housing 10 from impacting the curved portion 20*a* of the display 20 during assembly. Therefore, when the filling member 50 is injected into the connection hole 15, some of the filling member 50 may flow out of the housing 10 through the buffer space 135 between the housing 10 and the curved portion 20*a* of the display 20 (see arrow F).

In other words, when there is no blocking member 60 around the connection hole 15, the filling member 50 injected into the connection hole 15 may leak outside the housing 10 and damage the appearance of the portable electronic device.

However, in the portable electronic device 1 according to one or more embodiments of the present disclosure, the blocking member 60 disposed around the connection hole 15 prevents the filling member 50 from leaking to the outside, so damage to the exterior of the portable electronic device 1 due to leakage of the filling member 50 may be prevented.

Although non-limiting example embodiments have been illustrated and described above, it is understood by those skilled in the art that various modifications in form and detail may be made without departing from the scope of the present disclosure.

What is claimed is:

1. A portable electronic device comprising:
a housing;
a display comprising a window and a display panel, and one end of the display has a curved portion;
a buffer area formed along an edge of the housing such as to correspond to the curved portion of the display, the buffer area having a concave cross-section;
a first sealing member between the display panel and the housing; and
a second sealing member between the window and the housing and spaced apart from the first sealing member,
wherein the housing includes a connection hole that is between the first sealing member and the second sealing member and adjacent to the buffer area, and
wherein the portable electronic device further comprises:
a filling member that fills the connection hole and connects the first sealing member and the second sealing member; and
a blocking member between the connection hole and the buffer area and configured to block the filling member from flowing into the buffer area.

2. The portable electronic device of claim 1, wherein the blocking member is in contact with the second sealing member and one side end of the blocking member is bent towards the connection hole.

3. The portable electronic device of claim 2, wherein the blocking member is in contact with the first sealing member and another side end of the blocking member is bent toward the connection hole.

4. The portable electronic device of claim 3, wherein the portable electronic device further comprises a base on a lower surface of the blocking member, and
wherein the base comprises a closed loop shape surrounding a circumference of the connection hole.

5. The portable electronic device of claim 4, wherein an upper surface of the blocking member is a curved surface corresponding to the curved portion of the display panel.

6. The portable electronic device of claim 4, wherein a thickness of the blocking member gradually decreases from the lower surface of the blocking member to an upper surface of the blocking member.

7. The portable electronic device of claim 4, wherein the blocking member comprises a rib protruding toward the buffer area.

8. The portable electronic device of claim 4, wherein the housing comprises a seating portion that is formed along an entire circumference of the connection hole and the base is on the seating portion.

9. The portable electronic device of claim 8, wherein the base comprises a pair of protrusions, and
the seating portion comprises a pair of recessed portions corresponding to the pair of protrusions.

10. The portable electronic device of claim 8, wherein a bottom of the seating portion is a flat surface.

11. The portable electronic device of claim 4, wherein the blocking member comprises an elastic material.

12. The portable electronic device of claim 4, wherein the base comprises a material that has a strength greater than a strength of a material of the blocking member.

13. The portable electronic device of claim 1, wherein one side end of the blocking member is in contact with the second sealing member and is bent toward the connection hole, and
another side end of the blocking member is in contact with the first sealing member and is bent toward the connection hole.

14. The portable electronic device of claim 13, wherein the housing includes a mounting groove that is at least partially around the connection hole adjacent to the buffer area, and the mounting groove comprises a shape corresponding to the blocking member such that the mounting groove is configured to receive the blocking member.

15. The portable electronic device of claim 14, wherein the blocking member further comprises a rib protruding toward the connection hole between the one side end and the another side end of the blocking member.

16. The portable electronic device of claim 15, wherein the mounting groove of the housing further comprises a rib groove into which the rib is inserted.

17. The portable electronic device of claim 1, wherein the blocking member comprises:
one side end in contact with the second sealing member and bent toward the connection hole; and
an extension portion extending a predetermined length to the buffer area in parallel with the first sealing member, and
wherein the extension portion is spaced apart from the first sealing member.

18. The portable electronic device of claim 17, wherein the housing includes a mounting groove that is at a portion of the buffer area, at least partially around the connection hole, and the mounting groove comprises a shape corresponding to the blocking member such that the mounting groove is configured to receive the blocking member.

19. The portable electronic device of claim 1, wherein the blocking member extends from one end of the first sealing member that is adjacent to the connection hole, and one end of the blocking member is in contact with the second sealing member.

\* \* \* \* \*